United States Patent
Kreiskott et al.

(10) Patent No.: US 7,510,641 B2
(45) Date of Patent: Mar. 31, 2009

(54) HIGH CURRENT DENSITY ELECTROPOLISHING IN THE PREPARATION OF HIGHLY SMOOTH SUBSTRATE TAPES FOR COATED CONDUCTORS

(75) Inventors: Sascha Kreiskott, Los Alamos, NM (US); Vladimir Matias, Santa Fe, NM (US); Paul N. Arendt, Los Alamos, NM (US); Stephen R. Foltyn, Los Alamos, NM (US); Lawrence E. Bronisz, Los Alamos, NM (US)

(73) Assignee: Los Alamos National Security, LLC, Los Alamos, NM (US)

(*) Notice: Subject to any disclaimer, the term of this patent is extended or adjusted under 35 U.S.C. 154(b) by 49 days.

(21) Appl. No.: 10/624,350

(22) Filed: Jul. 21, 2003

(65) Prior Publication Data
US 2005/0016867 A1    Jan. 27, 2005

(51) Int. Cl.
C25F 3/16 (2006.01)
(52) U.S. Cl. .................. 205/640; 216/38
(58) Field of Classification Search .......... 205/640; 216/38
See application file for complete search history.

(56) References Cited

U.S. PATENT DOCUMENTS

| | | | |
|---|---|---|---|
| 2,330,562 A * | 9/1943 | Drummond et al. ......... 204/210 |
| 2,366,713 A * | 1/1945 | Faust ......................... 205/679 |
| 4,372,831 A * | 2/1983 | Rosswag .................... 205/675 |
| 5,066,370 A * | 11/1991 | Andreshak et al. ......... 205/651 |
| 5,843,290 A * | 12/1998 | Tezuka et al. .............. 204/206 |
| 5,922,091 A * | 7/1999 | Tsai et al. .................... 51/306 |
| 6,228,246 B1 * | 5/2001 | Datta et al. ................. 205/646 |
| 2003/0036483 A1 * | 2/2003 | Arendt et al. ............... 505/239 |
| 2003/0144150 A1 * | 7/2003 | Arendt et al. ............... 505/237 |
| 2003/0209185 A1 * | 11/2003 | Ueno et al. ..................... 117/2 |
| 2005/0000826 A1 * | 1/2005 | Qiao .......................... 205/660 |

OTHER PUBLICATIONS

Glowacki et al., Texture development in long lengths of NiFe tapes for superconducting coated conductor, Jan. 2002, Journal of Materials Science, vol. 37, No. 1, pp. 157-168.*

Harrison Electropolishing, http://www.harrisonep.com/services/electropolishing/default.html?kc=Im6TM&wcw=google&ex=uxyup6-eep549-qreaj1.*

* cited by examiner

*Primary Examiner*—Susy Tsang-Foster
*Assistant Examiner*—Nicholas A. Smith
(74) *Attorney, Agent, or Firm*—Bruce H. Cottrell; Juliet A. Jones

(57) ABSTRACT

A continuous process of forming a highly smooth surface on a metallic tape by passing a metallic tape having an initial roughness through an acid bath contained within a polishing section of an electropolishing unit over a pre-selected period of time, and, passing a mean surface current density of at least 0.18 amperes per square centimeter through the metallic tape during the period of time the metallic tape is in the acid bath whereby the roughness of the metallic tape is reduced. Such a highly smooth metallic tape can serve as a base substrate in subsequent formation of a superconductive coated conductor.

8 Claims, 1 Drawing Sheet

HIGH CURRENT DENSITY ELECTROPOLISHING IN THE PREPARATION OF HIGHLY SMOOTH SUBSTRATE TAPES FOR COATED CONDUCTORS

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

The present invention relates to a process of electropolishing metallic substrates to highly smooth surfaces suitable for subsequent deposition of an oriented film, e.g., a high temperature superconducting thick film with high $J_c$'s and $I_c$'s.

BACKGROUND OF THE INVENTION

Electropolishing is a well-known process for industrial large scale finishing of conducting surfaces. Electropolishing is most commonly used in static set-ups where the parts to be polished are immersed in a polishing bath. Less common, but still widespread in industry, is the use of electropolishing in a continuous process.

In electropolishing, a positive electrical potential is applied to a conducting material which is to be polished. The material is placed into an acid bath where there are additional electrodes to complete the electrical circuit. The built up electrical field strength depends locally on the surface topology. Protrusions on the material develop a stronger electrical field than grooves and holes. The etching of the material by the acid depends on the local current density at the acid-surface interface. The current density is directly related to the electrical field strength (Ohm's law), therefore, etch rates depend on the surface topology. Etching is enhanced on protrusions and weakened on grooves and holes. This results in a smoothening of the surface if suitable operating parameters are used. The process can be influenced by the following parameters: applied voltage/current, type of acid, acid concentration, temperature, and polishing time.

Coated conductors (superconductive tapes or films) usually involve a thick superconductive film on a polycrystalline metallic substrate wherein there are a number of intermediate layers between the superconductive film and the metallic substrate. These intermediate layers generally have a number of roles including, e.g., providing better smoothness to the base substrate, providing nucleation sites for subsequent layers, providing an epitaxial structure for alignment of subsequent layers, and providing buffer layers with structural and/or chemical compatibility to both other layers and any deposited superconductive film.

When the initial base substrate for a coated conductor is a polycrystalline nickel alloy, it usually has significant roughness, e.g., a root mean square (RMS) roughness of from 15 nanometers (nm) to 100 nm or greater. Such roughness hinders the subsequent deposition of optimal coating layers which results in reduced current carrying capacity by the subsequent superconductive film. Accordingly, there have been numerous efforts to reduce the roughness. Generally, to obtain the desired smoothness, the metallic substrate has been polished, either mechanically or chemically mechanically, to provide a smoother surface. Drawbacks to these approaches include processing speeds and the difficulty of scale-up. Enhanced smoothness for subsequent superconductive film depositions has also been sought through another coating layer, e.g., an inert oxide material layer upon the metallic substrate, where that layer can also be treated by chemical mechanical polishing. Drawbacks to this approach include the need for the extra layer of inert oxide material as well as processing speeds.

Further improvements in the structure and resultant properties of coated conductors remain desirable. After extensive and careful investigation, improvements have now been found in the preparation of highly smooth base metallic substrates having a RMS roughness of less than about 2 nm, preferably less than about 1 nm. Such highly smooth base metallic substrates can be used in obtaining high quality structural template articles desirable for the subsequent deposition of oriented films, e.g., high temperature superconducting films, especially YBCO superconducting films. Other applications for such highly smooth base metallic substrates may also be recognized by one skilled in the art.

It is an object of the present invention to provide a high current density electropolishing process for the preparation of highly smooth metallic substrates, especially metallic tapes.

It is another object of the present invention to provide a high current density electropolishing process for the preparation of highly smooth polycrystalline metal substrate tapes for coated conductor production.

SUMMARY OF THE INVENTION

To achieve the foregoing and other objects, and in accordance with the purposes of the present invention, as embodied and broadly described herein, the present invention provides a continuous process of forming a highly smooth surface to a metallic tape, the process including passing a metallic tape having an initial roughness through an acid bath contained within a polishing section of an electropolishing unit over a pre-selected period of time, and passing a mean surface current density of at least 0.18 amperes per square centimeter through the metallic tape during the period of time the metallic tape is in the acid bath whereby the roughness of the metallic tape is reduced. In a preferred embodiment, the electropolishing process uses a mean surface current density of at least 0.37 amperes per square centimeter through the metallic tape during the period of time the metallic tape is in the acid bath. In another embodiment of the present invention, an electrically conductive liquid completes an electrical circuit between the metallic tape and a cathode in the electropolishing unit while a pre-determined mean surface current density is applied to the metallic tape.

The process of the present invention also provides for production of an article, the article being a thin film template structure including a metallic substrate characterized by a RMS roughness of less than about 4 nm, the smoothness of the metallic substrate provided through an electropolishing process using a mean surface current density of at least 0.18 amperes per square centimeter, one or more intermediate layers upon the surface of the metallic substrate, and, a layer of an oriented cubic oxide material having a rock-salt-like structure upon the one or more intermediate layers. In one embodiment of the present invention, the one or more intermediate layers include a layer of an inert oxide material upon the surface of the metallic substrate, and a layer of an oxide or oxynitride material upon the inert oxide material layer. In a preferred embodiment, the metallic substrate is characterized by a RMS roughness of less than about 1 nm.

DETAILED DESCRIPTION

Figure 1:
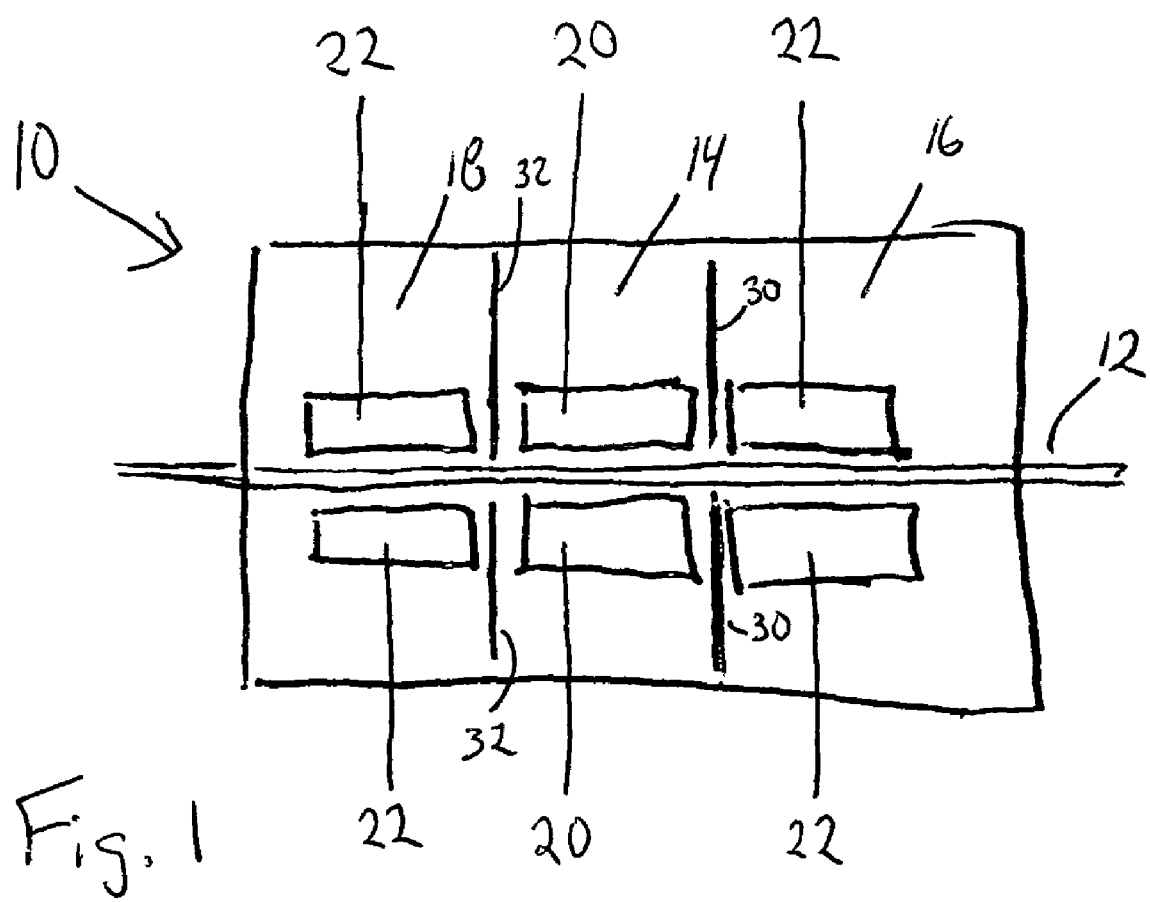
FIG. 1 shows a top view of an exemplary electropolishing unit used in the process of the present invention.

The present invention is concerned with the preparation of highly smooth metallic substrates. One important use for such highly smooth metallic substrates is for high temperature superconducting wire or tape and the use of high temperature superconducting thick films to form such wire or tape. The present invention is also concerned with the preparation of structural template articles for the subsequent deposition of oriented films, e.g., superconducting thick films.

Polishing of the metallic substrate has seemed necessary in the production of coated conductors. An electropolishing process allows for an efficient commercial process. Scale up of electropolishing to high polishing rates can be accomplished by processing additional tapes within the same bath. The total current increases linearly with the amount of tape, which is not a limiting factor. By use of longer acid baths or additional acid baths, the production rate may be influenced positively. Furthermore, with the use of high current densities and high tape speed, a high production rate of polished highly smooth tape can be achieved. In comparison, mechanical polishing cannot be easily scaled up.

A highly smooth metallic base substrate surface is desirable. By "highly smooth" is meant a surface having a RMS roughness of less than about 4 nm, preferably less than about 1 nm.

In the process of the present invention, the base substrate can be, e.g., any polycrystalline material such as a metal. Preferably, the substrate can be a polycrystalline metal such as nickel. Alloys including nickel such as various Hastelloy metals, Haynes metals and Inconel metals are also useful as the substrate. The base substrate may also be a textured metal or metal alloy, e.g., pure nickel, copper, nickel alloy or copper alloy as described by Goyal et al. in U.S. Pat. No. 5,741,377. Substrates from such a textured metal process are generally referred to as rolling assisted biaxially textured substrates (RABiTS). The metal substrate on which the superconducting material is eventually deposited should preferably allow for the resultant article to be flexible whereby superconducting articles (e.g., coils, motors or magnets) can be shaped. It is typical for the base substrates to have an initial RMS roughness of more than about 10 nm. Such a roughness can lead to decreases in resultant coated conductor properties.

In the process of the present invention, a initial metallic tape having an initial roughness, e.g., a RMS roughness of more than about 10 nm, can be passed into an acid bath. In a continuous process, the metallic tape can be passed from one reel to another and can be maintained within the acid batch for a pre-selected period of time by adjustment of the speed of the tape from one reel to another.

The acid bath used in the process of the present invention can include one or more acids, e.g., sulfuric acid, phosphoric acid or combination thereof. Preferably, the acid bath can be a mixture of sulfuric acid and phosphoric acid together with additional additives, such a mixture available as EPS 4000 from Electro Polish Systems, Inc. (Brown Deer, Wis.).

The acid bath is maintained within a polishing section of an electropolishing unit. An exemplary electropolishing unit is shown in FIG. 1 wherein metallic tape 12 is shown passing through electopolishing unit 10. Electropolishing unit 10 can include a polishing section 14 between a first rinsing section 16 and a second rinsing section 18. Within the polishing section 14 are situated cathodes 20. Anodes 22 are situated within the rinsing sections 16 and 18. The sections can be separated by non-conductive baffles 30 and 32 thereby minimizing direct current flow between electrodes that would not contribute to polishing. In one setup, the electropolishing unit can have an overall length of about 30 centimeters (cm). The polishing section of the electropolishing unit can be filled to the desired level with the acid bath and the acid bath can be pumped from an external sump tank into the electropolishing unit while the acid bath can exit out of the polishing section through an overflow port to ensure sufficient acid circulation. The temperature of the acid bath can be generally controlled during the process within the range of about 20° C. and about 100° C. by a heating/cooling system. The electropolishing unit further includes the necessary electrodes, e.g., gold-plated electrodes, for application of the current to the metallic tape. Within rinsing sections 16 and 18 can be included a liquid other than the acid bath and in one embodiment of the invention, rinsing sections 16 and 18 can include an electrically conductive liquid so that an electrical circuit can be completed within the system. The acid bath can serve as an electrically conductive liquid within polishing section 14.

In the electropolishing process of the present invention, a positive electrical potential can be applied to the metallic tape from the anodes within the electropolishing unit. In one embodiment, cathodes located within the polishing section are connected to mechanical contacts in direct physical contact with the metallic tape to complete the electrical circuit.

The electropolishing process needs high surface current densities in order to obtain the highly smooth surfaces. At a RMS roughness of less than about 1 nm such surfaces are nearly atomically smooth surfaces. It has been generally found that mean surface current densities of at least 0.18 amperes per square centimeter are needed in the metallic tapes used to produce coated conductors with the desired smoothness. More preferably, mean surface current densities of at least 0.37 amperes per square centimeter are used to produce coated conductors with the desired smoothness.

The process is strictly nonlinear in its current-polishing time behavior. However, the overall current, which can be conducted through the tape, is limited by the high resistivity of the metallic tape. Therefore, high surface current densities are not easily obtained. Due to the nonlinearity of the current-time behavior, lower current densities cannot be compensated for by simply lengthening the polishing times. Furthermore, low current density polishing can cause anisotropic etching of different grain orientations in a polycrystalline metallic tape and may cause a strong pronouncement of the grain boundaries such that the roughness is increased.

In one embodiment, the use of smaller electrodes can increase the current density locally because of less active area for a constant current through the tape. Polishing time would have to be increased, but less than reciprocal to the shortening ratio of the bath. Increase of the number of electropolishing baths can make up for loss in polishing speed.

Optionally, electrolytic contacts, i.e., an electrically conductive liquid, can be employed in the process. Use of an electrically conductive liquid can avoid resistive heating of the metallic tape as the tape is in thermal equilibrium with the liquid. The electrically conductive liquid can be the acid bath within the polishing section and can be any suitable electrically conductive liquid within the adjacent sections of an electropolishing unit. Use of an electrically conductive liquid can minimize transition areas with low current densities by active control of the potential distribution across the metallic tape. Another advantage of electrically conductive liquids is that mechanical contacts can potentially scratch the tape during the very electropolishing process designed to smooth the metallic tape. As the metallic tape is contacted symmetrically with respect to the acid bath used in the electropolishing to obtain uniform current distribution to the acid bath, such a uniform current distribution needed in the electropolishing process. This results in already polished areas of the metallic tape being mechanically contacted as the polished metallic tape exits the polishing section. The potential for a scratch on an already polished area is highly undesirable.

Following the electropolishing in the process of the present invention, the highly smooth metallic tape can be passed from the acid bath within the polishing section of the electropolishing unit and into a rinsing section of the electropolishing unit. Any remaining acid upon the metallic tape can be removed by an air stream, e.g., an air knife. Subsequently, the polished metallic tape can be rinsed several times with deionized water and dried in an air stream. Before any final rinsing and drying, the metallic tape can be further subjected to an acid solution, any suitable mineral acid, to remove any materials that can occasionally be deposited upon the metallic tape during the polishing stage.

In one embodiment, the polishing voltage can be applied to the metallic tape through leds from the anodes. Mechanical brass brush contacts, at the sides of the polishing section of the electropolishing station, can be in contact with the cathodes the tape as it passes through. In another embodiment, an electrically conductive liquid can be employed, e.g., the acid bath itself within the polishing section, serves to complete the electrical circuit between the cathodes, anodes and the metallic tape. Use of electrically conductive liquids can be generally preferred as the elimination of mechanical contact removes the possibility of scratching of the metallic tapes by the brush contacts. Additionally, there would be no possible arcing (electrical sparks from inevitable local non-uniformity of mechanical contacts) within the contact bath as the electrical contacts with the metallic tape would be a liquid, e.g., the acid bath or another conductive liquid.

In another aspect of the present invention, template articles can be prepared using the electropolished metallic tapes having a highly smooth RMS roughness level of less than about 1 nm. The template articles further include selected intermediate layers deposited upon the metallic tape prior to deposition of a preferred magnesium oxide layer.

A first intermediate layer can be a layer of an inert oxide material that does not react with the base metallic substrate or with any subsequently deposited materials. Examples of suitable inert oxide materials include aluminum oxide ($Al_2O_3$), erbium oxide ($Er_2O_3$), yttrium oxide ($Y_2O_3$), and yttria-stabilized zirconia (YSZ). The inert oxide layer (from about 100 nm to about 1000 nm) can be deposited on the polished metallic substrate by pulsed laser deposition, e-beam evaporation, sputtering or by any other suitable means. The layer is deposited at temperatures of generally greater than about 400° C. With aluminum-containing metal substrates, a layer of aluminum oxide can be directly formed in situ by heating at from about 800° C. to about 1000° C. in an oxygen atmosphere.

A second intermediate layer of an oxide or oxynitride material can then be generally deposited upon the inert oxide material layer as a nucleation layer for oriented growth of subsequent layers. The oxide or oxynitride layer (from about 5 nm to about 100 nm) can be deposited on the inert oxide material layer by similar means as the inert oxide material layer was deposited. The layer is generally deposited at temperatures of generally about 100° C. Among the oxide or oxynitride materials suitable as this layer are included yttrium oxide ($Y_2O_3$), aluminum oxynitride (AlON), erbium oxide ($Er_2O_3$), yttria-stabilized zirconia (YSZ), cerium oxide ($CeO_2$), europium oxide, nickel aluminate ($NiAl_2O_4$), and barium zirconate ($BaZrO_3$). Preferably, the layer of oxide or oxynitride material is yttrium oxide, aluminum oxynitride, erbium oxide or yttria-stabilized zirconia and more preferably is yttrium oxide or erbium oxide. In another embodiment, a single layer of an aluminum phosphate layer may be deposited on the metallic tape as the one or more intermediate layer.

This article including the one or more intermediate layers provides an excellent substrate for the subsequent deposition of a layer of an oriented cubic oxide material having a rock-salt-like structure. Such oriented cubic oxide materials can be, e.g., magnesium oxide, calcium oxide, strontium oxide, zirconium oxide, barium oxide, europium oxide, samarium oxide and other materials such as described in WO 99/25908 by Do et al. Preferably, the layer of oriented cubic oxide material having a rock-salt-like structure is a magnesium oxide (MgO) layer preferably deposited by electron beam evaporation with an ion beam assist (IBAD).

A thin homo-epitaxial layer (about 100 nm) of the MgO can be optionally deposited on the initial layer of IBAD-MgO via a process such as electron beam or magnetron sputter deposition. Deposition of the homo-epitaxial layer can be quicker than depositing the entire MgO layer by ion beam assisted deposition.

In one embodiment, a thin film template structure is provided in accordance with the present invention and includes a metallic substrate characterized by a RMS roughness of less than 4 nm, preferably less than about 1 nm, such smoothness provided by the electropolishing process described herein, a layer of an inert oxide material upon the surface of the substrate, a layer of an oxide or oxynitride material upon the inert oxide material layer, and, a layer of an oriented cubic oxide material having a rock-salt-like structure upon the oxide or oxynitride material layer. Such a thin film template structure is useful for subsequent deposition of epitaxial thin films. Such epitaxial thin films can be formed from a material selected from the group consisting of superconductors, including high temperature superconductors, semiconductors, photovoltaic materials, magnetic materials, and precursors of superconductors or high temperature superconductors. The thin film template structure is especially preferred for subsequent deposition of high temperature superconductor materials. Depending upon the particular epitaxial thin film material deposited upon the thin film template structure, additional layers such as buffer layers can be employed for enhanced chemical or structural compatibility. In the case of YBCO as a high temperature superconductor, buffer layers are generally employed although they are not required.

One or more intermediate layers are deposited onto the MgO layer so that they are between the MgO layer deposited by the IBAD process and the superconducting YBCO layer. The one or more intermediate layers serve as buffer layers between the MgO layer and the YBCO and assist in lattice matching. These layers should have good "structural compatibility" between the MgO or other oriented cubic oxide material deposited in the IBAD process and the YBCO and should have good chemical compatibility with both adjacent layers. By "chemical compatibility" is meant that the intermediate layer does not undergo property-degrading chemical interactions with the adjacent layers. By "structural compatibility" is meant that the intermediate layer has a substantially similar lattice structure with the superconductive material. Among the materials suitable as one or more intermediate buffer layers are cerium oxide, yttria-stabilized zirconia, strontium titanate, strontium ruthenate, yttrium oxide, europium copper oxide ($Eu_2CuO_4$), neodymium copper oxide ($Nd_2CuO_4$), yttrium copper oxide ($Y_2CuO_4$), other rare earth copper oxides ($RE_2CuO_4$) and the like. In a preferred embodiment, the thin film template structures of the present invention include a layer of yttria-stabilized zirconia or strontium titanate on the MgO layer and a top-layer of yttrium oxide or cerium oxide for the layer of yttria-stabilized zirconia.

A high temperature superconducting (HTS) layer, e.g., a YBCO layer, can be deposited, e.g., by pulsed laser deposition or by methods such as evaporation including co-evaporation, e-beam evaporation and activated reactive evaporation, sputtering including magnetron sputtering, ion beam sputtering and ion assisted sputtering, cathodic arc deposition, chemical vapor deposition, organometallic chemical vapor deposition, plasma enhanced chemical vapor deposition, molecular beam epitaxy, a sol-gel process, liquid phase epitaxy and the like.

The high temperature superconducting (HTS) material is generally YBCO, e.g., $YBa_2Cu_3O_{7-\delta}$, $Y_2Ba_4Cu_7O_{14+x}$, or $YBa_2Cu_4O_8$, although other minor variations of this basic superconducting material, such as use of other rare earth metals as a substitute for some or all of the yttrium as is well known, may also be used. Other superconducting materials such as bismuth and thallium based superconductor materials may also be employed. $YBa_2Cu_3O_{7-\delta}$ is preferred as the superconducting material.

The present invention is more particularly described in the following examples which are intended as illustrative only, since numerous modifications and variations will be apparent to those skilled in the art.

EXAMPLE 1

For the electropolishing of Hastelloy C276 nickel based tape, the tape can be run through the circulating acid bath at speeds between about 10 and 67 centimeters per minute (cm/min), generally about 20 cm/min. The acid bath can include a mixture of highly concentrated sulphuric acid and phosphoric acid. After the polishing step, the tape was rinsed several times with deionized water at room temperature. Finally, the tape was dried in an air stream. The acid temperature was maintained at 70° C. With the equipment system as originally obtained from the manufacturer (Metfab Technologies Inc., Warwick, R.I.), the polishing current was limited to 10 Amperes (A). The tape's surface in the acid was approximately 60 square centimeters (sq-cm); therefore, the resulting mean surface current density on the surface of the tape was limited to a maximum of about 0.17 A/sq-cm. While polishing experiments at this current density and below did show some improvement in smoothness (RMS of above 4 nm), it still did not show the desired increase in surface smoothness. Consequently, a power supply with higher current capability was used for additional runs. A current between about 11 A and 24 A was passed through the tape into the acid which resulted in an mean surface current density of from 0.18 A/sq-cm to 0.37 A/sq-cm. With the use of electropolishing at mean surface current densities of 0.18 A/sq-cm and above, the smoothness of the tape surface was reduced to RMS values of less than 1 nm. At levels of 0.37 A/sq-cm, RMS roughness values of only 0.5 nm were obtained. No upper limit for the mean surface current density has been found in terms of electropolishing effectiveness. The higher the polishing current, the better, i.e., smoother, the resultant tape surface. The mean surface current density at the surface is limited by the current density in the tape between current contacts and acid. With the existing setup, currents of more than 24 A cannot be fed into the batch without overheating the tape due to resistive losses in the tape. For resistive losses cannot be avoided easily, the experimental setup may be changed in order to increase the current density on the tape surface without having to increase the amount of current into the bath. Other electrode designs may allow for increased current.

The improvement in surface smoothness by electropolishing directly translated into an improved in-plane alignment of an IBAD-MgO layer on the tape surface. Improved in-plane alignment allows higher current densities in the superconducting layer. The beneficial effect on the eventual template layer from the smoother surfaces achieved through applying electropolishing to the tapes was verified by experiments. The in-plane alignment of the IBAD-MgO layer improved from a range from about 7.1° to about 9.5° with mechanically polished tape (RMS roughness of about 3.5 nm) to a range from about 6.6° to about 7.0° with electropolished tape (RMS roughness of about 0.5 nm).

EXAMPLE 2

On a polished substrate (Hastelloy C276) from example 1, was deposited by magnetron sputter deposition a layer of aluminum oxide about 800 to about 1000 Angstroms in thickness. Onto this resultant article was deposited a layer of $Y_2O_3$ (about 5 nm) by e-beam evaporation. Onto this resultant article was deposited a layer of MgO about 10 nm in thickness. An ion-assisted, electron beam evaporation system similar to that of Wang et al., App. Phys. Lett., v. 71, no. 20, pp. 2955-2957 (1997), was used to deposit a MgO film upon the yttrium oxide layer. The substrates were ultrasonically cleaned in soap and water, rinsed with deionized water, rinsed with methanol and blown dry with filtered nitrogen. The ion source was manufactured by Ion Tech, Inc. (Ft. Collins, Colo.) with a source geometry of 22 cm by 2.5 cm. The substrate normal to ion-assist beam angle was 45±3°. The ion source gas was argon. The ion source gas was introduced to a background partial pressure of about $1.0 \times 10^{-6}$ Torr with a total pressure during deposition of about $1 \times 10^{-4}$ Torr. The electron gun heated the MgO source to maintain a deposition rate of about 0.15 nm/sec. The ion-assist gun voltage and current density were about 750 eV and 100 $\mu A/cm^2$ respectively. Onto the IBAD-MgO layer was then deposited a layer of homo-epitaxial MgO by e-beam evaporation.

EXAMPLE 3

On the template structure of example 2 was deposited a layer of strontium ruthenate ($SrRuO_3$) about 30 nm in thickness by pulsed laser deposition. Onto the layer of $SrRuO_3$ was deposited a layer of YBCO about 1650 nm in thickness by pulsed laser deposition. The $J_c$ was measured as $1.5 \times 10^6$ $A/cm^2$ using a standard four-point measurement. In the first experiment, the critical current densities in a subsequently deposited YBCO layer on the electropolished tape were comparable to the best results from mechanically polished tape. Better results may be expected through process optimization.

Although the present invention has been described with reference to specific details, it is not intended that such details should be regarded as limitations upon the scope of the invention, except as and to the extent that they are included in the accompanying claims.

What is claimed is:

1. A continuous process of providing a highly smooth surface to a metallic tape, the process comprising:

passing a metallic tape consisting essentially of an uncoated polycrystalline nickel alloy having an initial roughness of more than about 10 nm as a RMS roughness through an acid bath contained within a polishing section of an electropolishing unit over a pre-selected period of time; and, passing a mean surface current density of at least 0.37 amperes per square centimeter through the metallic tape during the period of time the metallic tape is in the acid bath whereby the roughness of the metallic tape is reduced to a RMS roughness of less than about 1 nm;

depositing a layer of oriented cubic oxide material onto the metallic tape having a roughness of less than about 1 nm, wherein the in-plane alignment of the oriented cubic oxide material is less than about 7 degrees.

2. The process of claim 1 wherein the RMS roughness of the metallic tape is reduced to less than 0.5 nm.

3. The process of claim 1 wherein the acid bath consists essentially of a mixture of sulphuric acid and phosphoric acid.

4. The process of claim 1 wherein the metallic tape is in direct electrical contact with an anode in said electropolishing unit while said metallic tape is within an electrically conductive liquid throughout said electropolishing unit and within said acid bath in said polishing section, said acid bath further in contact with a cathode in said electropolishing unit so as to complete an electrical circuit.

5. The process of claim 4 wherein the anode includes a metal selected from the group consisting of titanium, niobium, tantalum, platinum, rhenium, rhodium, nickel, chromium, gold and silver.

6. The process of claim 5 wherein the acid bath consists essentially of a mixture of sulphuric acid and phosphoric acid.

7. The process of claim 1 wherein the metallic tape is in direct electrical contact with an anode in said electropolishing unit while said metallic tape is in contact with mechanical contacts as the metallic tape is passed through the acid bath so as to complete an electrical circuit.

8. The process of claim 1 wherein the metallic tape is passed through the acid bath and the acid bath provides electrical contact with the metallic tape.

* * * * *